(12) United States Patent
Kachi et al.

(10) Patent No.: US 10,340,133 B2
(45) Date of Patent: Jul. 2, 2019

(54) METHOD FOR FABRICATING SEMICONDUCTOR DEVICE

(71) Applicant: Mitsubishi Electric Corporation, Tokyo (JP)

(72) Inventors: Takao Kachi, Tokyo (JP); Yasuhiro Yoshiura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/738,507

(22) PCT Filed: Jul. 15, 2015

(86) PCT No.: PCT/JP2015/070234
§ 371 (c)(1),
(2) Date: Dec. 20, 2017

(87) PCT Pub. No.: WO2017/009964
PCT Pub. Date: Jan. 19, 2017

(65) Prior Publication Data
US 2018/0190508 A1    Jul. 5, 2018

Related U.S. Application Data

(63) Continuation of application No. PCT/JP2015/070234, filed on Jul. 15, 2015.

(51) Int. Cl.
*H01L 21/02* (2006.01)
*H01L 29/868* (2006.01)
(Continued)

(52) U.S. Cl.
CPC .... *H01L 21/0206* (2013.01); *H01L 21/30604* (2013.01); *H01L 21/31111* (2013.01);
(Continued)

(58) Field of Classification Search
CPC ............................ H01L 21/56; H01L 21/0206
See application file for complete search history.

(56) References Cited

U.S. PATENT DOCUMENTS

| 7,326,656 B2 * | 2/2008 | Brask ..................... H01L 21/845 257/E21.442 |
| 2015/0380558 A1 * | 12/2015 | Huang ............... H01L 29/66795 257/288 |

FOREIGN PATENT DOCUMENTS

| JP | H03-133161 A | 6/1991 |
| JP | H08-335705 A | 12/1996 |

(Continued)

OTHER PUBLICATIONS

International Preliminary Report on Patentability issued in PCT/JP2015/070234; dated Jan. 25, 2018.
(Continued)

*Primary Examiner* — William Coleman
(74) *Attorney, Agent, or Firm* — Studebaker & Brackett PC

(57) ABSTRACT

A silicon oxide film having at least one opening portion is formed, on a silicon substrate. A structural member formed of a material less prone to be etched by hydrofluoric acid than a silicon oxide film is formed, wherein the structural member is provided on the silicon oxide film and reaches the silicon substrate in the opening portion. Wet etching using hydrofluoric acid is performed, on the silicon substrate on which the silicon oxide film and the structural member are provided. The interface between the silicon oxide film and the structural member is exposed to hydrofluoric acid, in performing the wet etching.

8 Claims, 19 Drawing Sheets

(51) Int. Cl.
*H01L 21/306* (2006.01)
*H01L 29/66* (2006.01)
*H01L 21/311* (2006.01)
H01L 21/56 (2006.01)
H01L 29/06 (2006.01)

(52) U.S. Cl.
CPC ........ *H01L 29/6609* (2013.01); *H01L 29/868* (2013.01); *H01L 21/56* (2013.01); *H01L 29/0619* (2013.01)

(56) References Cited

FOREIGN PATENT DOCUMENTS

| | | |
|---|---|---|
| JP | H08-339996 A | 12/1996 |
| JP | 2005-101181 A | 4/2005 |

OTHER PUBLICATIONS

International Preliminary Report on Patentability issued in PCT/JP20151070234; dated Jan. 16, 2018.

International Search Report issued in PCT/JP2015/070234; dated Aug. 11, 2015.

\* cited by examiner

F I G. 1
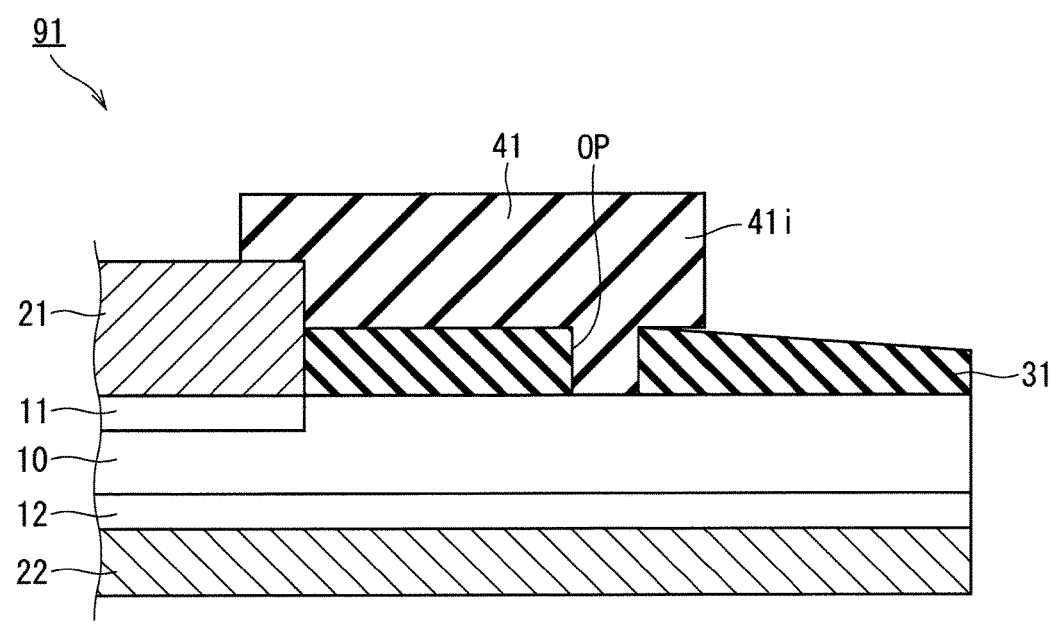

METHOD FOR FABRICATING SEMICONDUCTOR DEVICE

TECHNICAL FIELD

The present invention relates to methods for fabricating semiconductor devices and, more particularly, relates to methods for fabricating semiconductor devices using wet etching.

BACKGROUND ART

In methods for fabricating semiconductor devices, it is necessary to clean the surfaces of Si (silicon) substrates, in some cases. More specifically, in some cases, it is necessary to remove natural oxide films or foreign substances from the surfaces of Si substrates. For example, foreign substances on the Si surfaces may cause abnormal diffusions during addition of impurities thereto.

For example, according to Japanese Patent Application Laid-Open No. 8-339996 (1996) (Patent Document 1), a $SiO_2$ film (a silicon oxide film) is formed on a Si substrate. Further, a $SiO_x$ film (x>2) is formed on the silicon oxide film. Further, an opening portion is formed in the layer-laminated structure constituted by the silicon oxide film and the $SiO_x$ film. Along with the process for forming the opening portion, a natural oxide film is formed on the Si substrate in the opening portion. This natural oxide film is removed using hydrofluoric acid. This can provide a cleaned Si surface having been hydrogen-terminated in the opening portion.

PRIOR ART DOCUMENT

Patent Document

Patent Document 1: Japanese Patent Application Laid-Open No. 8-339996 (1996)

SUMMARY OF INVENTION

Problems to be Solved by the Invention

According to the technique described in the aforementioned publication, the surface of the silicon oxide film is covered with the $SiO_x$ film (x>2) and, therefore, is protected against etching using hydrofluoric acid. However, according to the technique described in the aforementioned publication, hydrofluoric acid intrudes along the interface between the silicon oxide film and the $SiO_x$ film, so that the $SiO_x$ film can be separated from the silicon oxide film.

This will be described more generally, as follows. At first, a silicon oxide film is provided on a Si substrate. Further, a structural member formed of a material less prone to be etched by hydrofluoric acid than the silicon oxide film is provided on the silicon oxide film. In cases of performing etching using hydrofluoric acid on the Si substrate prepared as described above, hydrofluoric acid intrudes along the interface between the silicon oxide film and the structural member, which can separate the structural member from the silicon oxide film. This separation causes reduction of the yield, if this separation occurs during the fabrication of semiconductor devices. Further, this separation causes reduction of the life of the products if this separation occurs after the fabrication.

The present invention was made in order to overcome the aforementioned problem and aims at providing a method for fabricating a semiconductor device which can suppress the separation of a structural member provided on a silicon oxide film, in etching using hydrofluoric acid.

Means for Solving the Problems

A method for fabricating a semiconductor device according to the present invention includes processes as follows. A silicon oxide film having at least one opening portion is formed, on a silicon substrate. A structural member formed of a material less prone to be etched by hydrofluoric acid than the silicon oxide film is formed, wherein the structural member is provided on the silicon oxide film and reaches the silicon substrate in the opening portion. Wet etching using hydrofluoric acid is performed, on the silicon substrate on which the silicon oxide film and the structural member have been provided. An interface between the silicon oxide film and the structural member is exposed to hydrofluoric acid, in performing the wet etching.

Effects of the Invention

According to the method for fabricating a semiconductor device according to the present invention, at first, the structural member provided on the silicon oxide film reaches the silicon substrate in the opening portion in the silicon oxide film. Thus, unevenness is provided, due to the opening portion, in the surface on which the structural member is provided. Secondly, the structural member formed of the material which is less prone to be etched by hydrofluoric acid than the silicon oxide film is extended into the opening portion in the silicon oxide film. Thus, the structural member within the opening portion blocks the progress of hydrofluoric acid intruded through the interface between the silicon oxide film and the structural member. Due to the aforementioned facts, it is possible to suppress the separation of the structural member from the silicon oxide film.

Objects, features, aspects, and advantages of the present invention will become more apparent in light of the following detailed description and the accompanying drawings.

BRIEF DESCRIPTION OF DRAWINGS

FIG. 1 is a partial cross-sectional view schematically illustrating the structure of a semiconductor device according to a first embodiment of the present invention.

DESCRIPTION OF EMBODIMENTS

Figure 2:
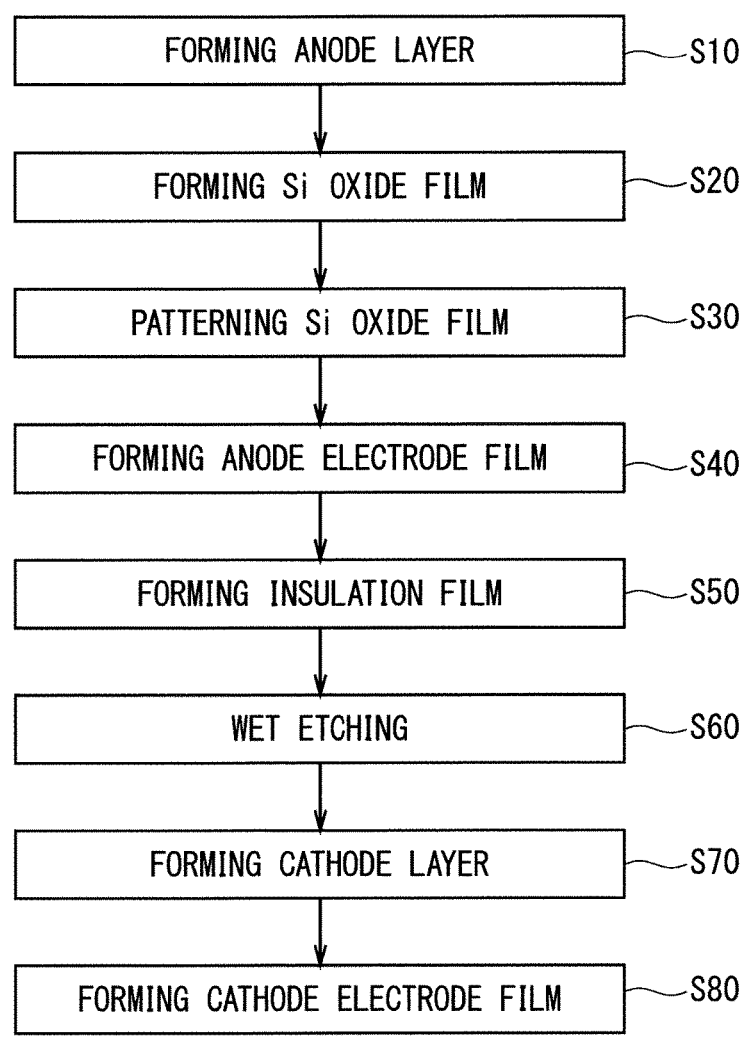
FIG. 2 is a flow chart schematically illustrating the structure of a method for fabricating the semiconductor device according to the first embodiment of the present invention.

Hereinafter, embodiments of the present invention will be described, with reference to the drawings. Further, in the following drawings, the same or corresponding components will be designated by the same reference characters and will not be described redundantly.

First Embodiment

FIG. 1 is a partial cross-sectional view schematically illustrating the structure of a diode 91 (a semiconductor device) according to the present embodiment. More specifically, the diode 91 is a pin diode as an power semiconductor device. The diode 91 includes a Si substrate 10 (a silicon substrate), an anode layer 11, a cathode layer 12, an anode electrode film 21, a cathode electrode film 22, a $SiO_2$ film 31 (a silicon oxide film), and a protective structural member 41 (a structural member).

The Si substrate 10 is a single-crystal substrate formed of Si. The anode layer 11 is a p-type impurity-diffusion layer, which is provided on a center portion (in the left side in the figure) of the upper surface (one surface) of the Si substrate 10. The cathode layer 12 is an n-type impurity-diffusion layer, which is provided on the lower surface (the other surface) of the Si substrate 10.

The anode electrode film 21 is provided on the anode layer 11. The anode electrode film 21 is separated, at an end portion thereof, from an end portion (the right end in the figure) of the Si substrate 10. The cathode electrode film 22 is provided on the cathode layer 12. The materials of the anode electrode film 21 and the cathode electrode film 22 are preferably materials which exhibit preferable ohmic contact characteristics with respect to Si and, for example, are Al (aluminum) or aluminum alloys such as Al—Si.

On the upper surface of the Si substrate 10, on its outer peripheral portion around its center portion on which the anode layer 11 is provided, there is provided the $SiO_2$ film 31. The $SiO_2$ film 31 has an opening portion OP. The opening portion OP may be either extended linearly or formed as a local hole.

The protective structural member 41 is provided on the $SiO_2$ film 31 and is extended onto the end portion of the anode electrode film 21. Thus, the protective structural member 41 partially covers the anode electrode film 21 and, more specifically, covers the outer peripheral portion of the anode electrode film 21. The protective structural member 41 reaches the Si substrate 10 in the opening portion OP. The portion of the protective structural member 41 which comes in contact with the anode electrode film 21 is preferably formed of an insulation material. Further, the exposed surface (the upper surface in the figure) of the protective structural member 41 is preferably formed of an insulation material. In the present embodiment, the protective structural member 41 is entirely formed of a single insulation film 41i.

FIG. 2 is a flow chart schematically illustrating the structure of a method for fabricating the diode 91. Each of FIGS. 3 and 4 is a partial cross-sectional view schematically illustrating a single process in the method for fabricating the diode 91.

Figure 3:
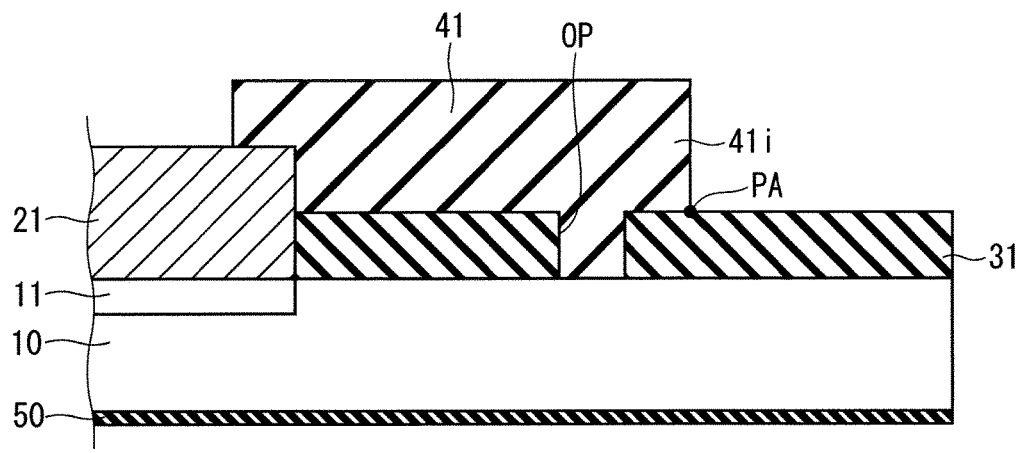
FIG. 3 is a partial cross-sectional view schematically illustrating a process in the method for fabricating the semiconductor device according to the first embodiment of the present invention.

Referring to FIG. 3, the anode layer 11 is formed on the upper surface of the Si substrate 10 by adding an impurity thereto (FIG. 2: step S10). The $SiO_2$ film 31 is formed on the Si substrate 10 (FIG. 2: step S20). As the method for forming the $SiO_2$ film 31, a thermal oxidation method or a deposition method can be employed, for example. Instead of thermal oxidation, natural oxidation can be also employed. Next, the opening portion OP is formed in the $SiO_2$ film 31 (FIG. 2: step S30). The anode electrode film 21 is formed on the anode layer 11 (FIG. 2: step S40).

The insulation film 41i is forming as the protective structural member 41 (FIG. 2: step S50). The insulation film 41i as the protective structural member 41 is provided on the $SiO_2$ film 31 and reaches the Si substrate 10 in the opening portion OP. The interface between the $SiO_2$ film 31 and the protective structural member 41 is exposed at a point PA positioned at an end portion of the protective structural member 41. The insulation film 41i as the protective structural member 41 is formed of a material which is less prone to be etched by hydrofluoric acid than $SiO_2$ film 31. For example, the insulation film 41i is formed of silicon nitride or glass.

Figure 4:
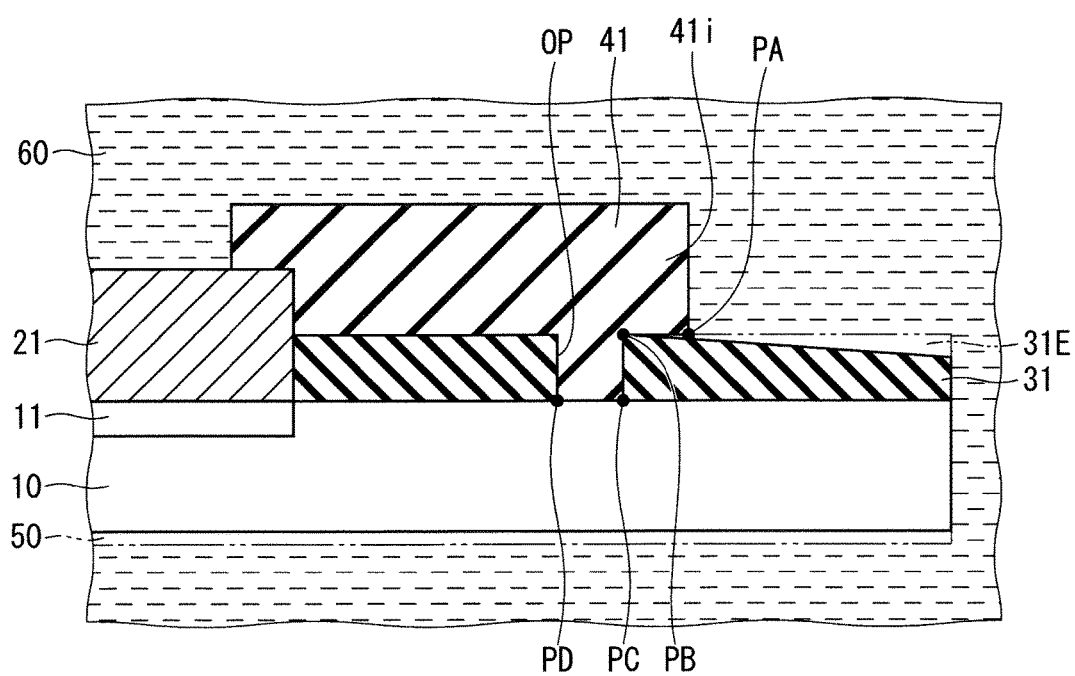
FIG. 4 is a partial cross-sectional view schematically illustrating a process in the method for fabricating the semiconductor device according to the first embodiment of the present invention.

Referring to FIG. 4, wet etching using hydrofluoric acid is performed on the Si substrate 10 on which the $SiO_2$ film 31 and the protective structural member 41 have been provided (FIG. 2: step S60). Through the wet etching, the lower surface of the Si substrate 10 is cleaned. More specifically, a natural oxide film 50 on the lower surface of the Si substrate 10 is removed by an etching liquid 60 containing hydrofluoric acid.

In the process for performing the wet etching, the $SiO_2$ film 31 is also etched to some degrees by being exposed to hydrofluoric acid (in the figure, the portion etched thereby is schematically represented by a two-dot chain line portion 31E). Particularly, the interface between the $SiO_2$ film 31 and the insulation film 41i is exposed to hydrofluoric acid at the point PA, so that the $SiO_2$ film 31 is etched thereby at the point PA. This induces a gap of about several angstroms between the $SiO_2$ film 31 and the protective structural member 41. This results in intrusion of hydrofluoric acid along the interface from the point PA. The intrusion of hydrofluoric acid can be stopped at a point PB positioned at an edge of the opening portion OP, as illustrated in FIG. 4. Further, even if the intrusion is not stopped at the point PB, and further intrusion occurs along the depthwise direction of the opening portion OP (in the longitudinal direction in the figure), the further intrusion is blocked at a point PC positioned on the bottom portion of the opening portion OP, which inhibits the occurrence of intrusion toward a point PD positioned in the opposite side in the opening portion OP.

This is because the protective structural member 41 and the Si substrate 10 which form the interface at the bottom portion of the opening portion OP are both formed of a material which is less prone to be etched by hydrofluoric acid.

Referring to FIG. 1, again, the cathode layer 12 is formed on the lower surface of the Si substrate by adding an impurity thereto (FIG. 2: step S70). The cathode electrode film 22 is formed on the cathode layer 12 (FIG. 2: step S80). In the aforementioned way, the diode 91 can be provided.

Figure 5:
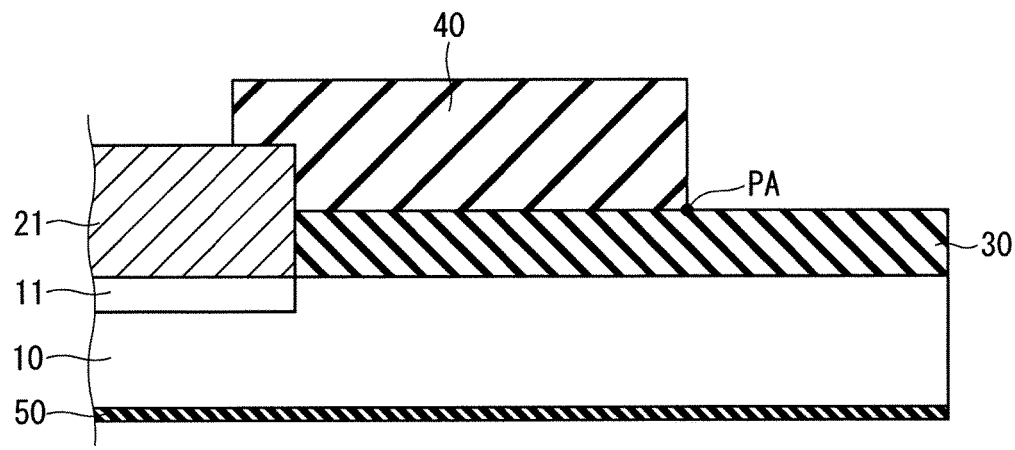
FIG. 5 is a partial cross-sectional view schematically illustrating a process in a method for fabricating a semiconductor device in a comparative example.
Figure 6:
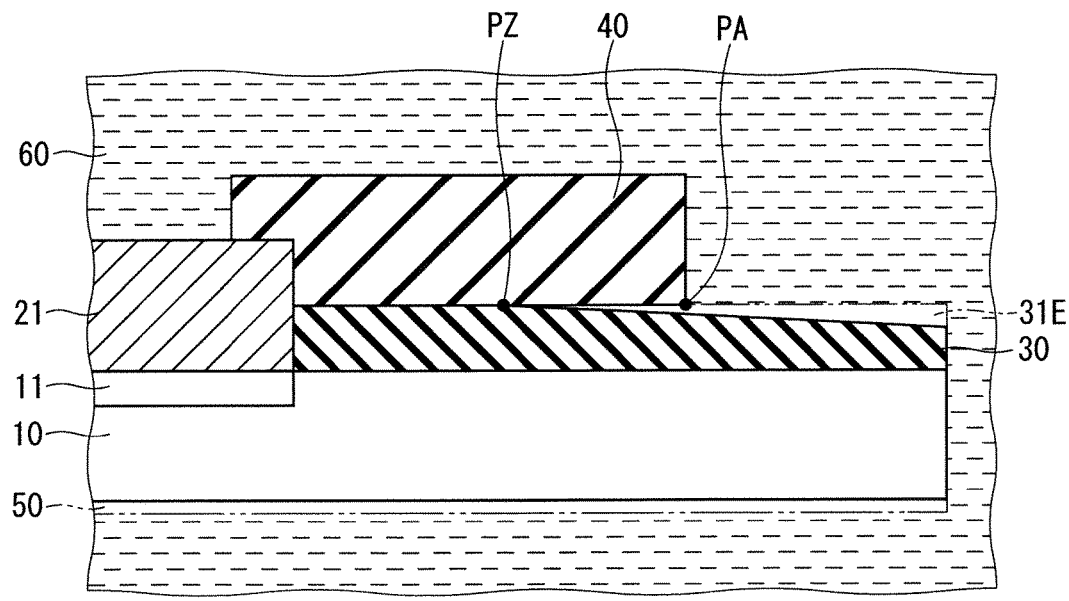
FIG. 6 is a partial cross-sectional view schematically illustrating a process in the method for fabricating a semiconductor device in the comparative example.
Figure 7:
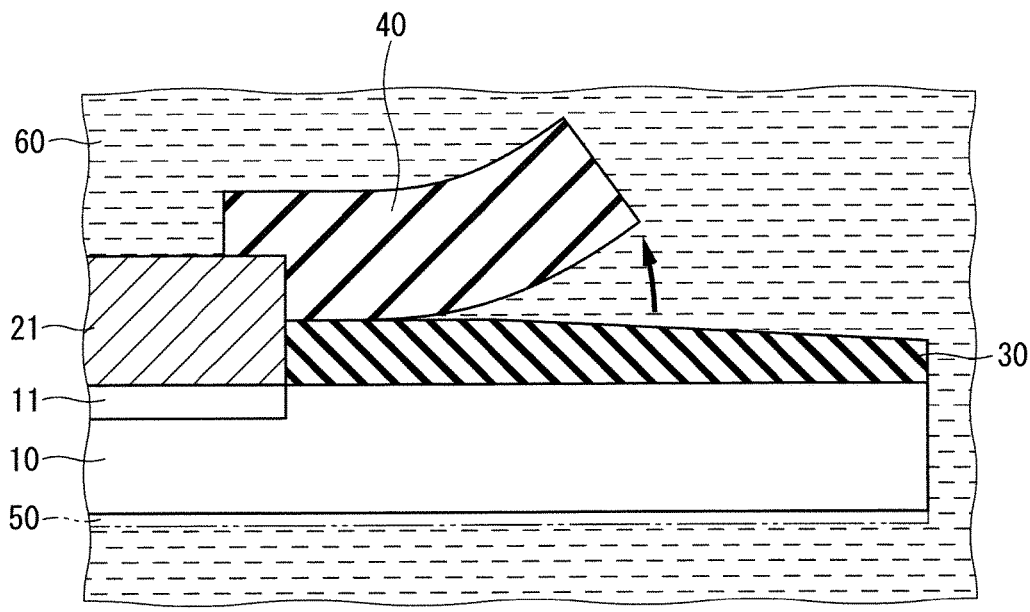
FIG. 7 is a partial cross-sectional view schematically illustrating a process in the method for fabricating a semiconductor device in the comparative example.

Next, a fabrication method in a comparative example will be described. Referring to FIG. 5, a $SiO_2$ film 30 in the comparative example has no opening portion OP, unlike the $SiO_2$ film 31 (FIG. 3). Accordingly, a protective structural member 40 is formed on the flat surface of the $SiO_2$ film 30, unlike the protective structural member 41 (FIG. 3). Referring to FIG. 6, the interface between the $SiO_2$ film 30 and the protective structural member 40 is exposed to hydrofluoric acid at a point PA. The $SiO_2$ film 30 is etched thereby at the point PA, which induces a gap of about several angstroms between the $SiO_2$ film 30 and the protective structural member 40. This results in intrusion of hydrofluoric acid along the interface from the point PA. FIG. 6 illustrates a state where hydrofluoric acid has intruded up to a point PZ. In the comparative example, there is provided no particular structure for inhibiting progress of such intrusion, which tends to cause hydrofluoric acid to intrude from the point PA more inwardly. Referring to FIG. 7, hydrofluoric acid intrudes inwardly along the interface between the $SiO_2$ film 30 and the protective structural member 40 greatly, which decreases the area of bonding between the $SiO_2$ film 30 and the protective structural member 40. This tends to induce separation of the protective structural member 40 from the $SiO_2$ film 30 (see an arrow in the figure).

On the contrary, according to the present embodiment, at first, the protective structural member 41 provided on the $SiO_2$ film 31 reaches the Si substrate 10 in the opening portion OP in the $SiO_2$ film 31. Thus, unevenness is provided, due to the opening portion OP, in the surface on which the protective structural member 41 is provided. This suppresses the separation of the protective structural member 41 from the $SiO_2$ film 31.

Secondly, the protective structural member 41 formed of a material which is less prone to be etched by hydrofluoric acid than the $SiO_2$ film 31 is extended into the opening portion OP in the $SiO_2$ film 31. Thus, the protective structural member 41 within the opening portion OP blocks the progress of hydrofluoric acid intruded through the interface between the $SiO_2$ film 31 and the protective structural member 41. Namely, the separation at the interface between the $SiO_2$ film 31 and the protective structural member 41 is inhibited from progressing. This can further suppress the separation of the protective structural member 41 from the $SiO_2$ film 31.

Second Embodiment

Figure 8:
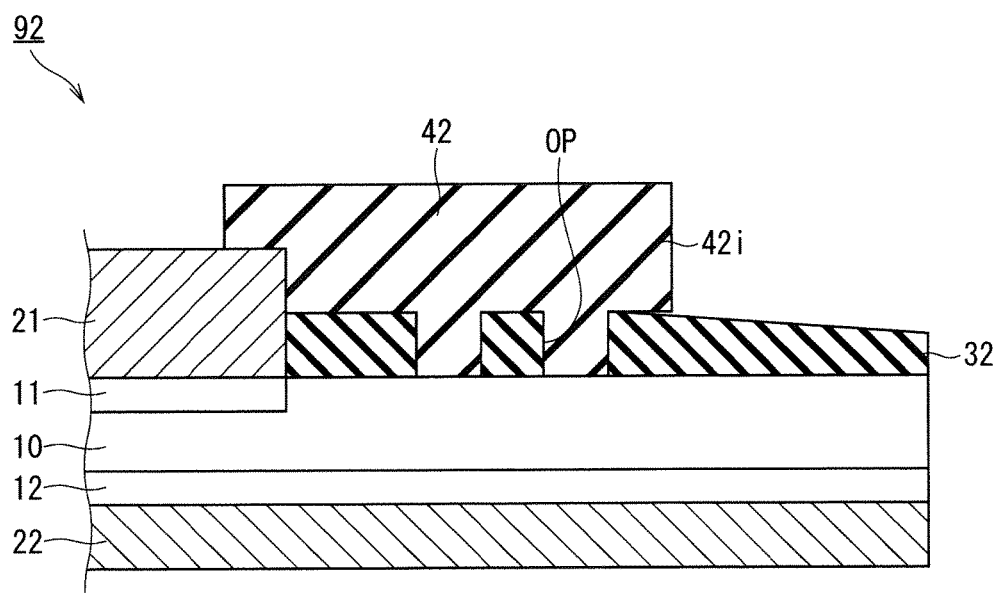
FIG. 8 is a partial cross-sectional view schematically illustrating the structure of a semiconductor device according to a second embodiment of the present invention.
Figure 9:
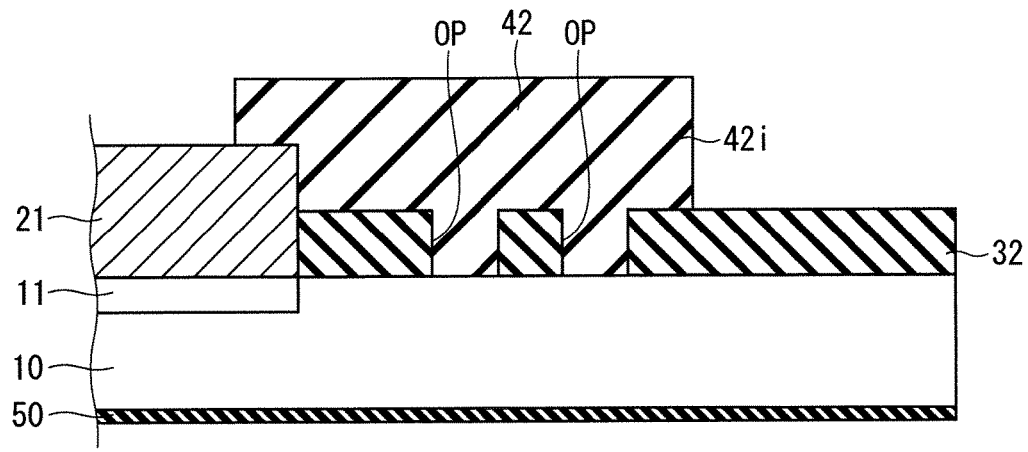
FIG. 9 is a partial cross-sectional view schematically illustrating a process in the method for fabricating the semiconductor device according to the second embodiment of the present invention.
Figure 10:
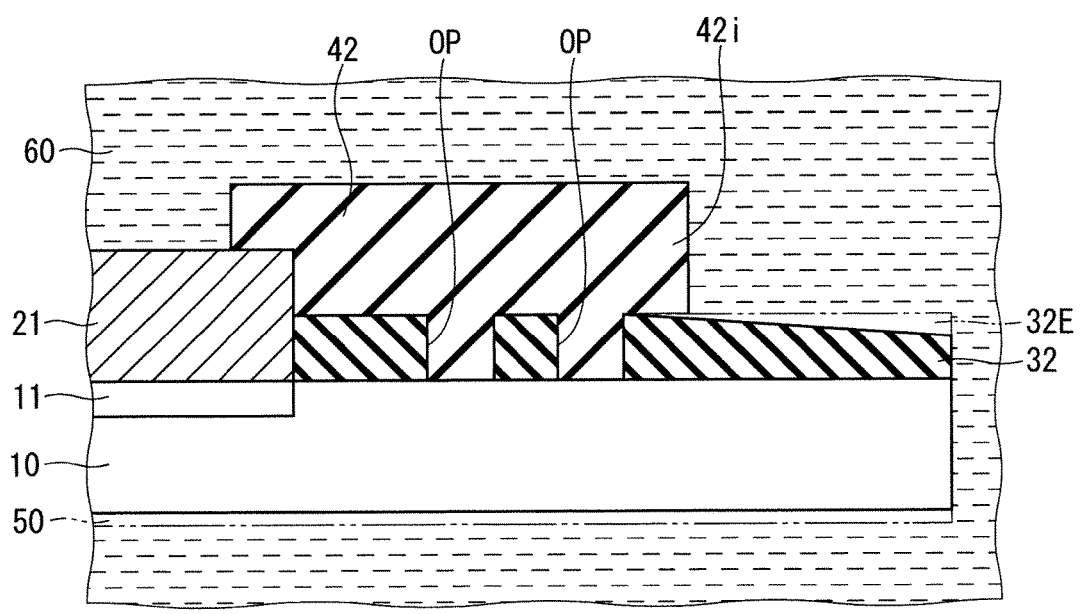
FIG. 10 is a partial cross-sectional view schematically illustrating a process in the method for fabricating the semiconductor device according to the second embodiment of the present invention.

FIG. 8 is a partial cross-sectional view schematically illustrating the structure of a diode 92 according to the present embodiment. The diode 92 includes a $SiO_2$ film 32 (a silicon oxide film) and a protective structural member 42 (a structural member), instead of the $SiO_2$ film 31 and the protective structural member 41 (FIG. 1: the first embodiment). In the present embodiment, the protective structural member 42 is constituted by a single insulation film 42i. The $SiO_2$ film 32 includes two or more opening portions OP. The insulation film 42i as the protective structural member 42 is provided on the SiO₂ film 32 and reaches a Si substrate 10 in the respective opening portions OP. Referring to FIG. 9 and FIG. 10, respectively, the diode 92 can be fabricated through substantially the same processes as the processes in FIGS. 3 and 4 according to the first embodiment. Further, a two-dot chain-line portion 32E (FIG. 10) in the SiO₂ film 32 schematically represents the etched portion, similarly to the two-dot chain-line portion 31E (FIG. 4) in the SiO₂ film 31.

Further, the structures other than the aforementioned structures are substantially the same as the structures according to the first embodiment and, therefore, the same or corresponding components are designated by the same reference characters and will not be described redundantly.

According to the present embodiment, the SiO₂ film 32 is provided with two or more opening portions OP. This enhances the effect of suppressing the separation of the protective structural member 42 from the SiO₂ film 32.

Third Embodiment

Figure 11:
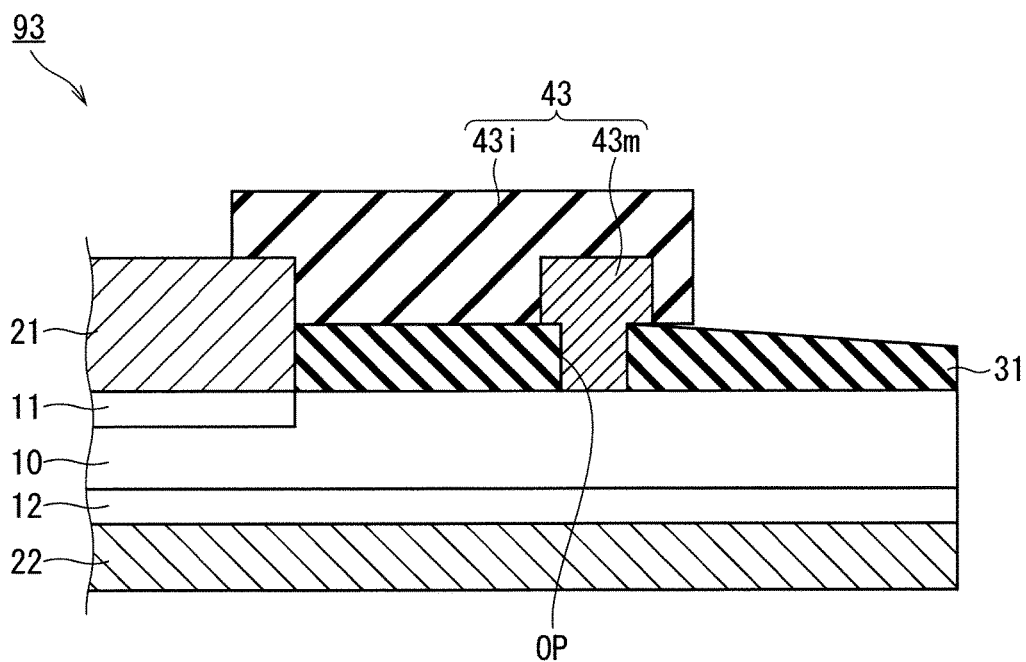
FIG. 11 is a partial cross-sectional view schematically illustrating the structure of a semiconductor device according to a third embodiment of the present invention.

FIG. 11 is a partial cross-sectional view schematically illustrating the structure of a diode 93 according to the present embodiment. The diode 93 includes a protective structural member 43 (a structural member), instead of the protective structural member 41 (FIG. 1: the first embodiment). The protective structural member 43 includes an insulation film 43i and a metal film 43m. The metal film 43m reaches a Si substrate 10 in an opening portion OP in a SiO₂ film 31. The metal film 43m preferably penetrates the opening portion OP. More preferably, the metal film 43m has a larger thick dimension than the depth dimension of the opening portion OP. Further, more preferably, the metal film 43m has a T-shaped cross-sectional shape. Thus, the metal film 43m has a portion protruded from the opening portion OP, on the SiO₂ film 31.

The insulation film 43i covers the metal film 43m. The insulation film 43i is disposed on the SiO₂ film 31 on which the metal film 43m is provided and, also, the insulation film 43i is extended onto an end portion of an anode electrode film 21. Thus, the insulation film 43i partially covers the anode electrode film 21 and, more specifically, covers an outer peripheral portion of the anode electrode film 21. The portion of the protective structural member 43 which comes in contact with the anode electrode film 21 is constituted by the insulation film 43i. Further, the exposed surface (the upper surface in the figure) of the protective structural member 43 is constituted by the insulation film 43i.

Figure 12:
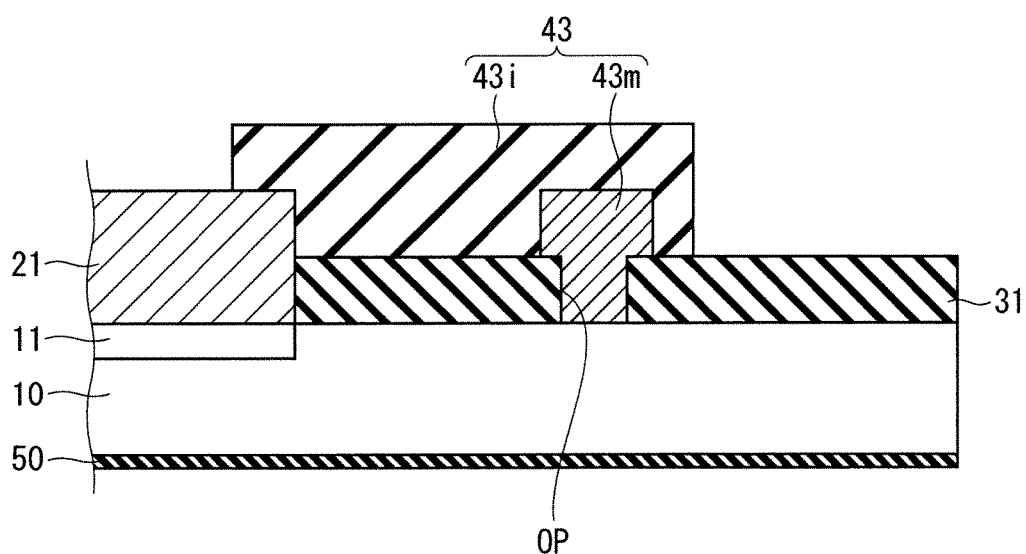
FIG. 12 is a partial cross-sectional view schematically illustrating a process in the method for fabricating the semiconductor device according to the third embodiment of the present invention.
Figure 13:
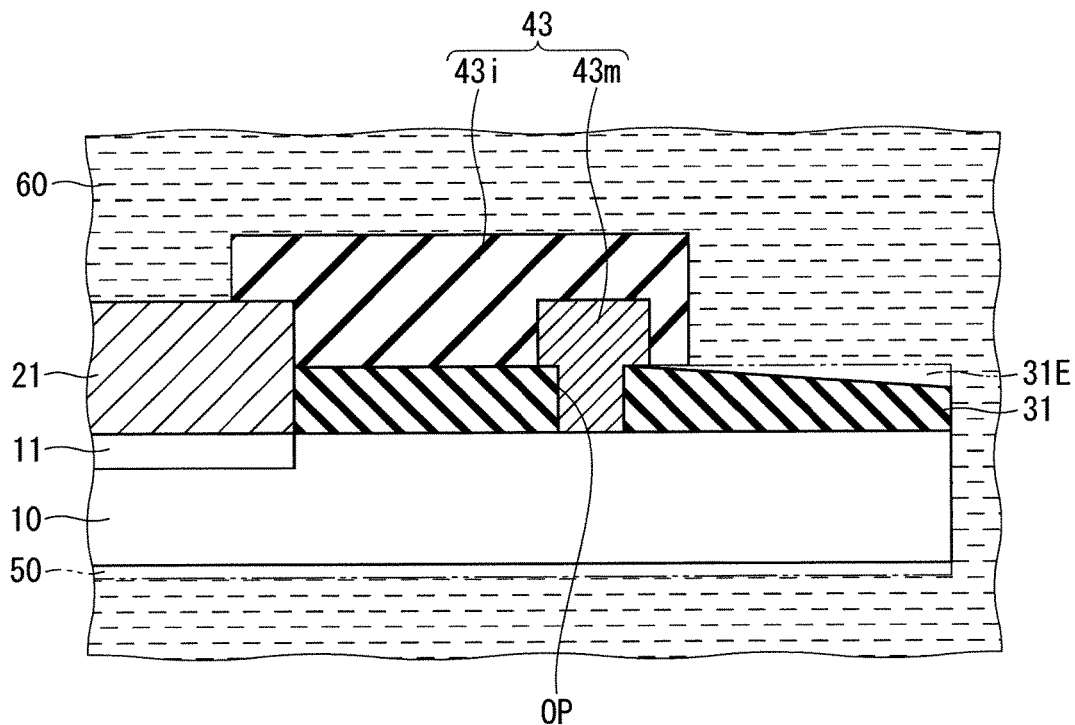
FIG. 13 is a partial cross-sectional view schematically illustrating a process in the method for fabricating the semiconductor device according to the third embodiment of the present invention.

Referring to FIG. 12 and FIG. 13, respectively, the diode 93 can be fabricated through processes similar to the processes in FIGS. 3 and 4 according to the first embodiment. In the present embodiment, the metal film 43m is formed, before the insulation film 43i is formed. The material of the metal film 43m can be the same as the material of the anode electrode film 21. In this case, the metal film 43m can be formed at the same time as the process for forming the anode electrode film 21 (FIG. 2: the step S40).

Further, the structures other than the aforementioned structures are substantially the same as the structures according to the aforementioned first embodiment and, therefore, the same or corresponding components are designated by the same reference characters and will not be described redundantly.

Fourth Embodiment

Figure 14:
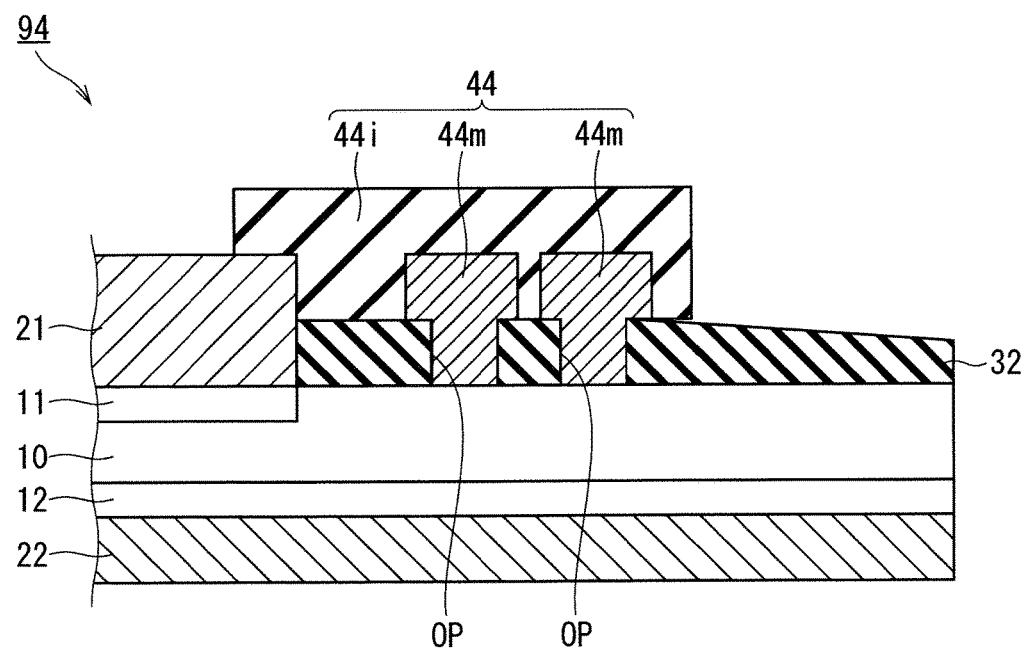
FIG. 14 is a partial cross-sectional view schematically illustrating the structure of a semiconductor device according to a fourth embodiment of the present invention.

FIG. 14 is a partial cross-sectional view schematically illustrating the structure of a diode 94 according to the present embodiment. The diode 94 includes a SiO₂ film 32 and a protective structural member 44 (a structural member), instead of the SiO₂ film 31 and the protective structural member 43 (FIG. 11: the third embodiment). The SiO₂ film 32 is the same as that (FIG. 8) according to the second embodiment and is provided with two or more opening portions OP. The protective structural member 44 includes an insulation film 44i and two or more metal films 44m. Each of the metal films 44m is the same as the metal film 43m.

Figure 15:
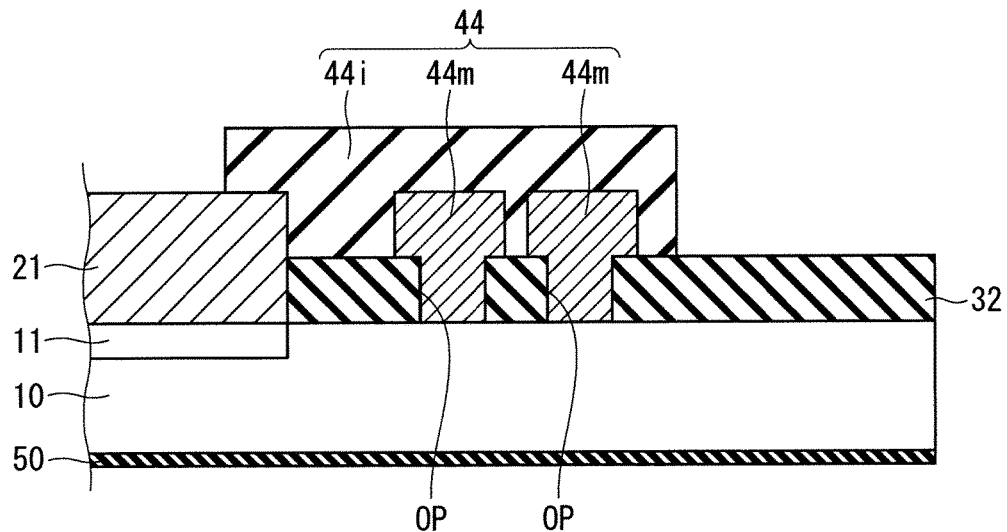
FIG. 15 is a partial cross-sectional view schematically illustrating a process in the method for fabricating the semiconductor device according to the fourth embodiment of the present invention.
Figure 16:
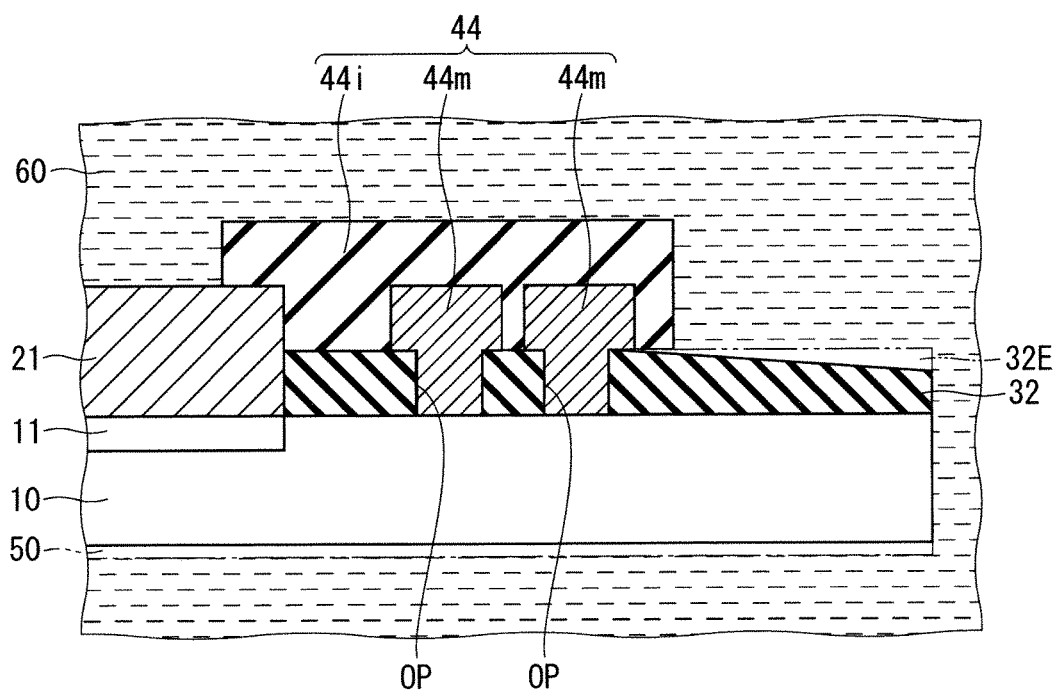
FIG. 16 is a partial cross-sectional view schematically illustrating a process in the method for fabricating the semiconductor device according to the fourth embodiment of the present invention.

Referring to FIG. 15 and FIG. 16, respectively, the diode 94 can be fabricated through substantially the same processes as the processes in FIGS. 12 and 13 according to the third embodiment.

Further, the structures other than the aforementioned structures are substantially the same as the structures according to the aforementioned third embodiment and, therefore, the same or corresponding components are designated by the same reference characters and will not be described redundantly.

According to the present embodiment, the SiO₂ film 32 is provided with two or more opening portions OP. This enhances the effect of suppressing the separation of the protective structural member 44 from the SiO₂ film 32.

Fifth Embodiment

Figure 17:
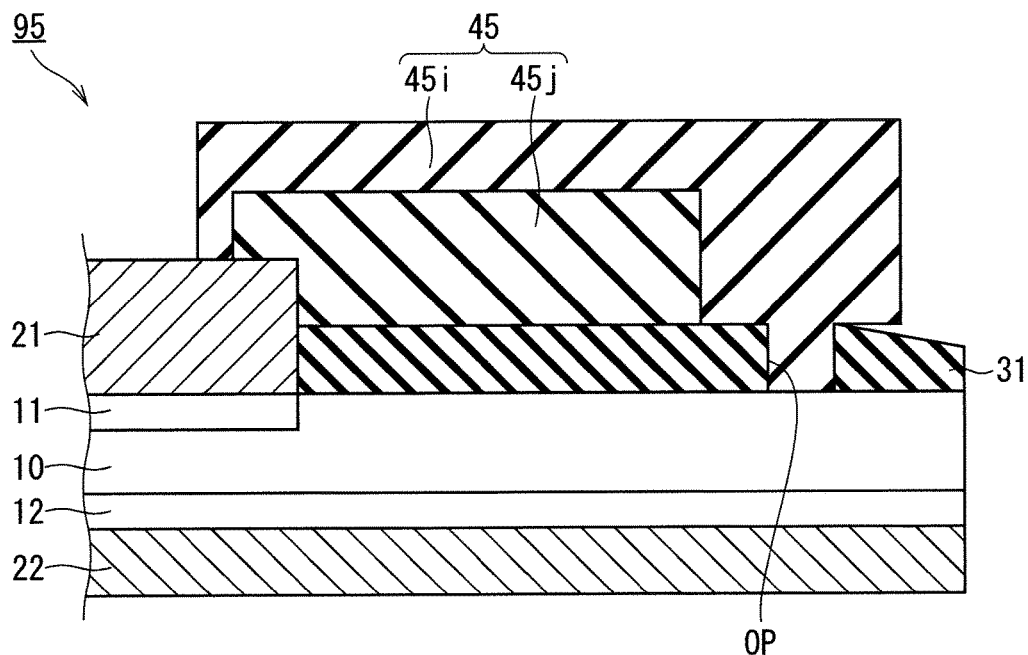
FIG. 17 is a partial cross-sectional view schematically illustrating the structure of a semiconductor device according to a fifth embodiment of the present invention.

FIG. 17 is a partial cross-sectional view schematically illustrating the structure of a diode 95 according to the present embodiment. The diode 95 includes a protective structural member 45 (a structural member), instead of the protective structural member 41 (FIG. 1: the first embodiment). The protective structural member 45 includes an outer insulation film 45i and an inner insulation film 45j. The outer insulation film 45i is formed of a polyimide, in the present embodiment. The material of the inner insulation film 45j is different from the material of the outer insulation film 45i and can be the same as that of the insulation film 41i (FIG. 1: the first embodiment). The inner insulation film 45j is provided on a SiO₂ film 31 and is extended onto an end portion of an anode electrode film 21. The outer insulation film 45i is disposed on the SiO₂ film 31 on which the inner insulation film 45j is provided. The outer insulation film 45i covers the inner insulation film 45j and extends onto the end portion of the anode electrode film 21. The outer insulation film 45i reaches a Si substrate 10 in an opening portion OP.

Figure 18:
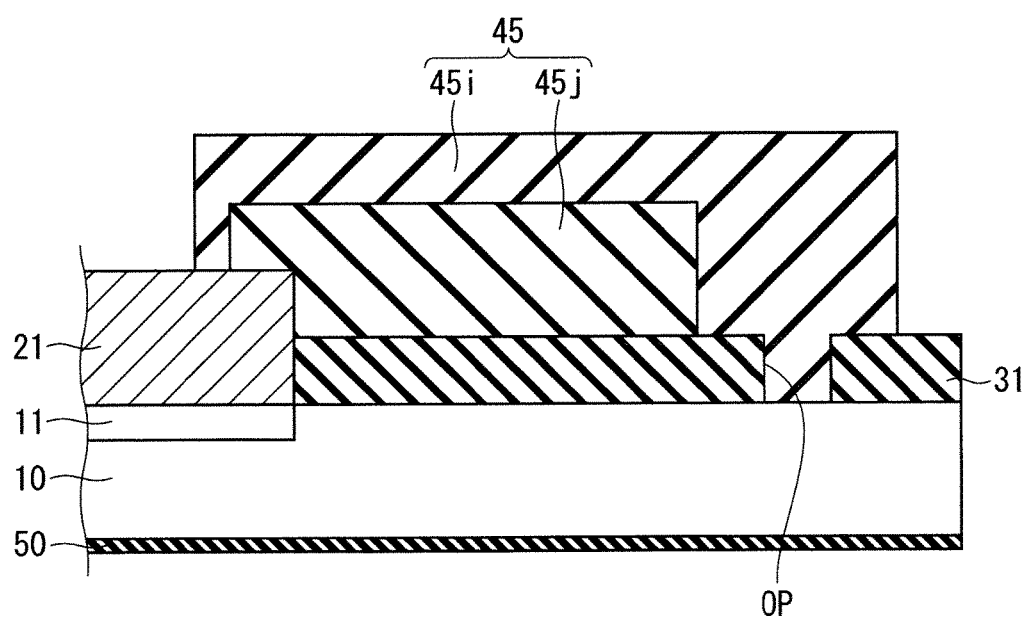
FIG. 18 is a partial cross-sectional view schematically illustrating a process in the method for fabricating the semiconductor device according to the fifth embodiment of the present invention.
Figure 19:
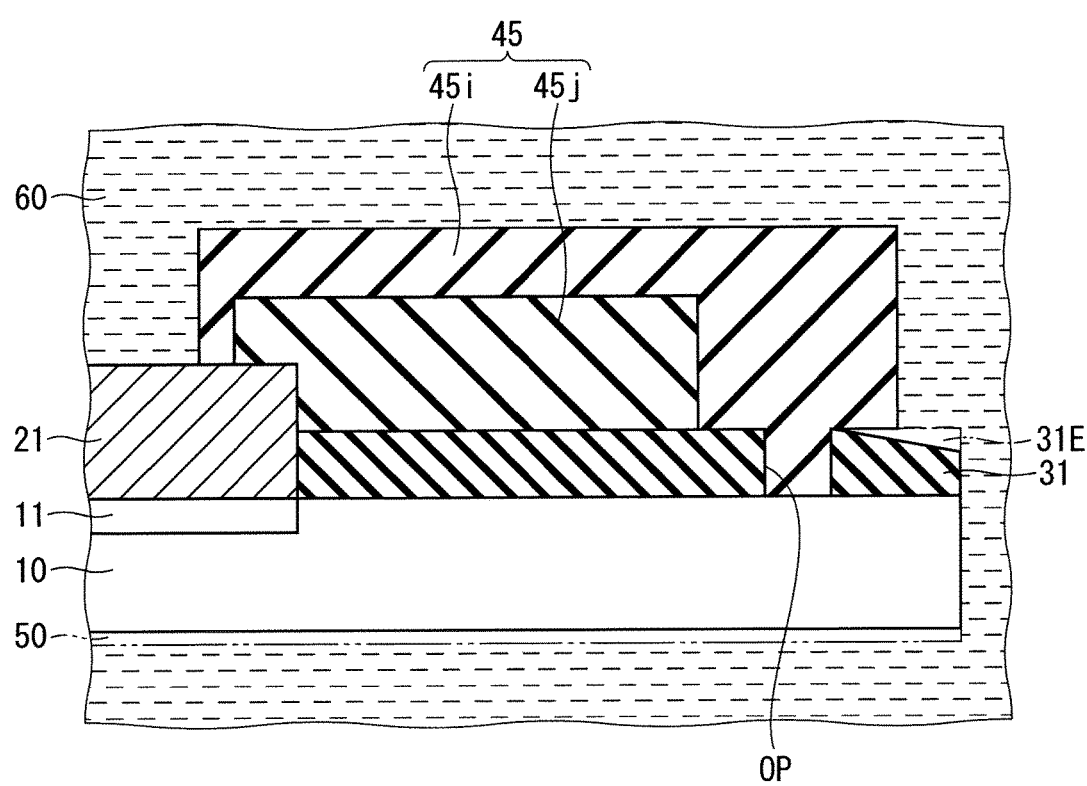
FIG. 19 is a partial cross-sectional view schematically illustrating a process in the method for fabricating the semiconductor device according to the fifth embodiment of the present invention.

Referring to FIG. 18 and FIG. 19, respectively, the diode 95 can be fabricated through substantially the same processes as the processes in FIGS. 3 and 4 according to the first embodiment. More specifically, instead of the process (the step S50) for forming the insulation film 41i (FIG. 3), a process for forming the inner insulation film 45j is performed and, subsequently thereto, a process for forming the outer insulation film 45i is performed. The formation of the outer insulation film 45i can be performed through a coating method. In this case, the opening portion OP can be easily filled therewith.

Further, the structures other than the aforementioned structures are substantially the same as the structures according to the aforementioned first embodiment and, therefore, the same or corresponding components are designated by the same reference characters and will not be described redundantly.

Sixth Embodiment

Figure 20:
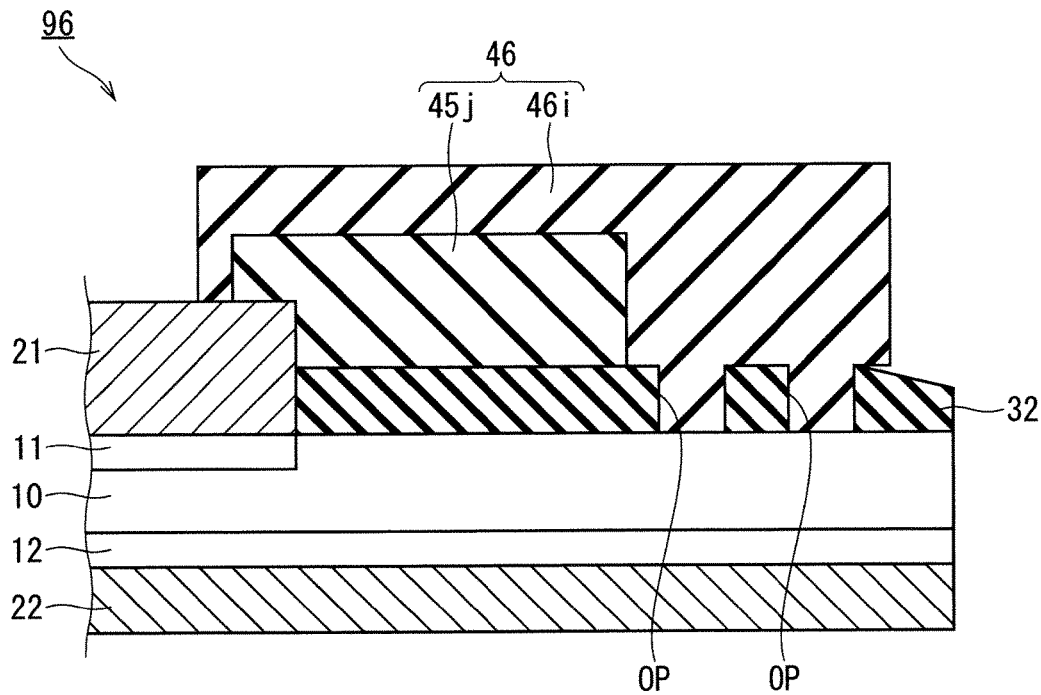
FIG. 20 is a partial cross-sectional view schematically illustrating the structure of a semiconductor device according to a sixth embodiment of the present invention.
Figure 21:
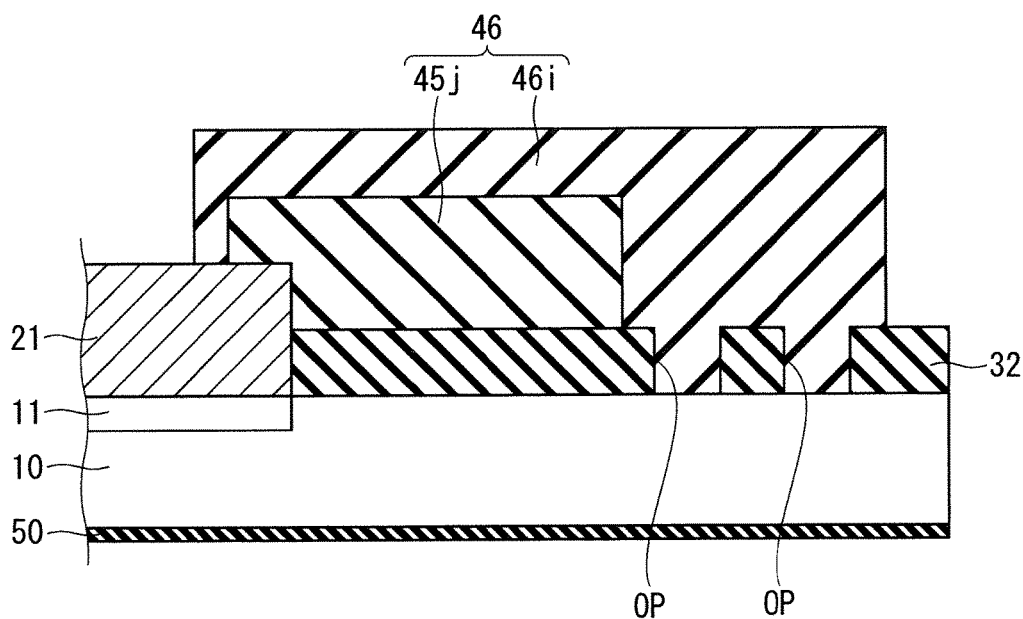
FIG. 21 is a partial cross-sectional view schematically illustrating a process in the method for fabricating the semiconductor device according to the sixth embodiment of the present invention.
Figure 22:
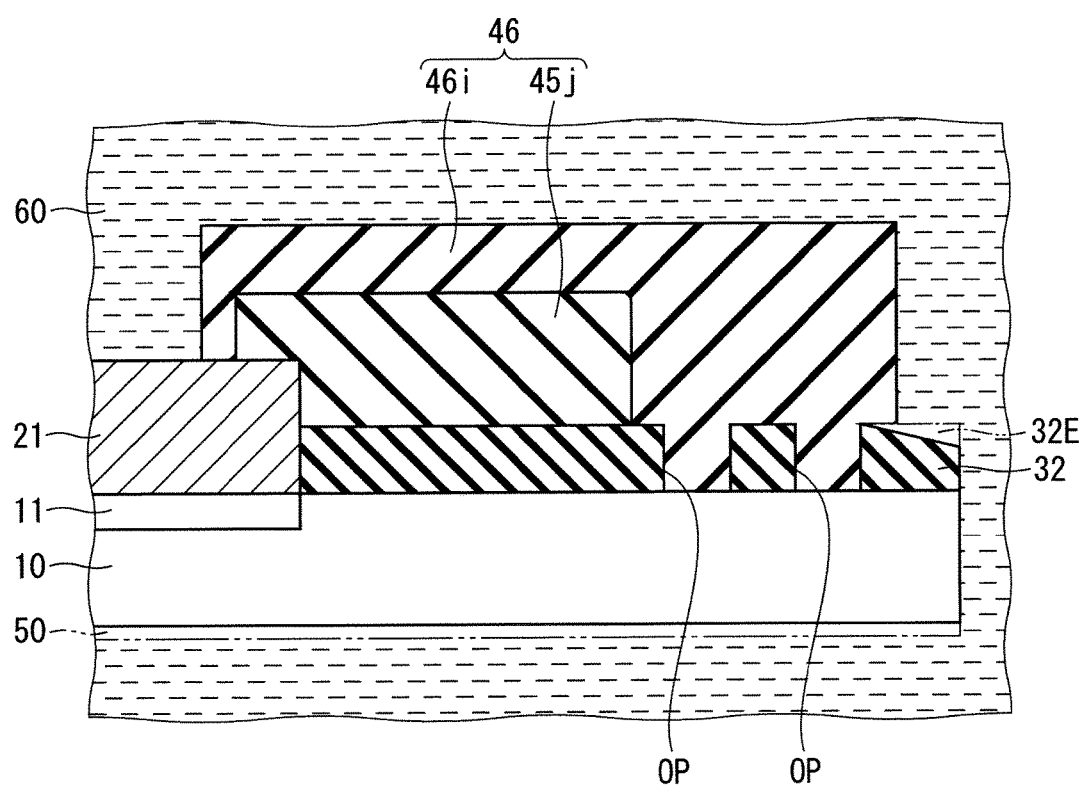
FIG. 22 is a partial cross-sectional view schematically illustrating a process in the method for fabricating the semiconductor device according to the sixth embodiment of the present invention.

FIG. 20 is a partial cross-sectional view schematically illustrating the structure of a diode 96 according to the present embodiment. The diode 96 includes the SiO₂ film 32 (FIG. 8) described in the second embodiment, and a protective structural member 46 (a structural member), instead of the SiO₂ film 31 and the protective structural member 45 (FIG. 17: the fifth embodiment). The protective structural member 46 includes an outer insulation film 46*i*, instead of the outer insulation film 45*i* (FIG. 17). The outer insulation film 46*i* is provided on the SiO₂ film 32 and reaches a Si substrate 10 in respective opening portions OP. Referring to FIG. 21 and FIG. 22, respectively, the diode 96 can be fabricated through substantially the same processes as the processes in FIGS. 18 and 19 according to the fifth embodiment.

Further, the structures other than the aforementioned structures are substantially the same as the structures according to the aforementioned fifth embodiment and, therefore, the same or corresponding components are designated by the same reference characters and will not be described redundantly.

According to the present embodiment, the SiO₂ film 32 is provided with two or more opening portions OP. This enhances the effect of suppressing the separation of the protective structural member 46 from the SiO₂ film 32.

Seventh Embodiment

Figure 23:
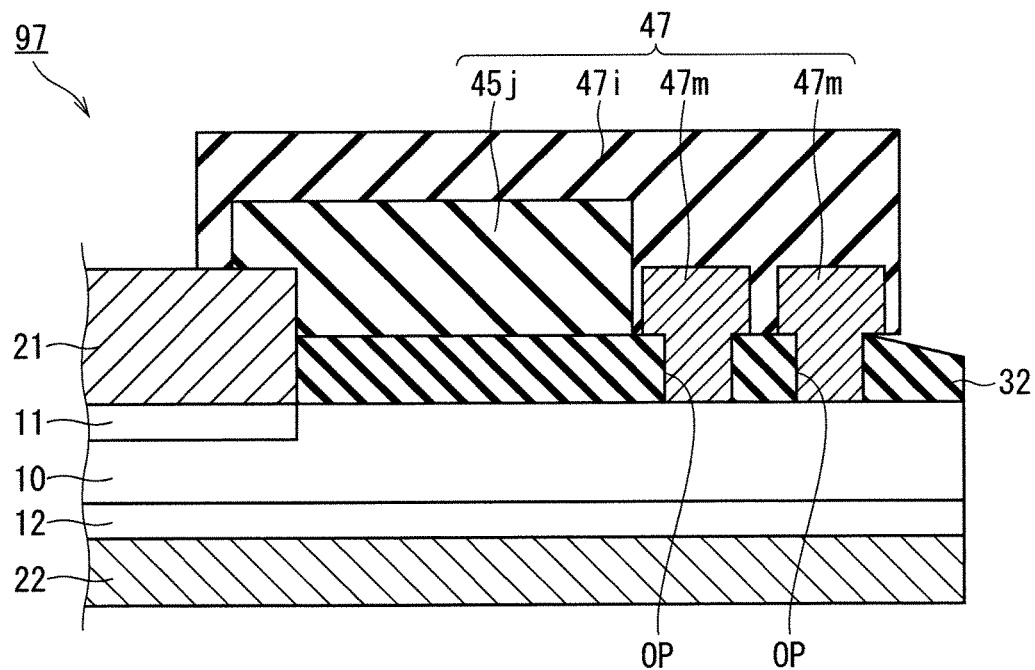
FIG. 23 is a partial cross-sectional view schematically illustrating the structure of a semiconductor device according to a seventh embodiment of the present invention.

FIG. 23 is a partial cross-sectional view schematically illustrating the structure of a diode 97 according to the present embodiment. The diode 97 includes a protective structural member 47 (a structural member), instead of the protective structural member 46 (FIG. 20: the sixth embodiment). The protective structural member 47 includes an outer insulation film 47*i* and metal films 47*m*, instead of the outer insulation film 46*i* (FIG. 20). Each of the metal films 47*m* is the same as the metal film 43*m* (FIG. 11: the third embodiment). The metal films 47*m* are covered with the outer insulation film 47*i*.

Figure 24:
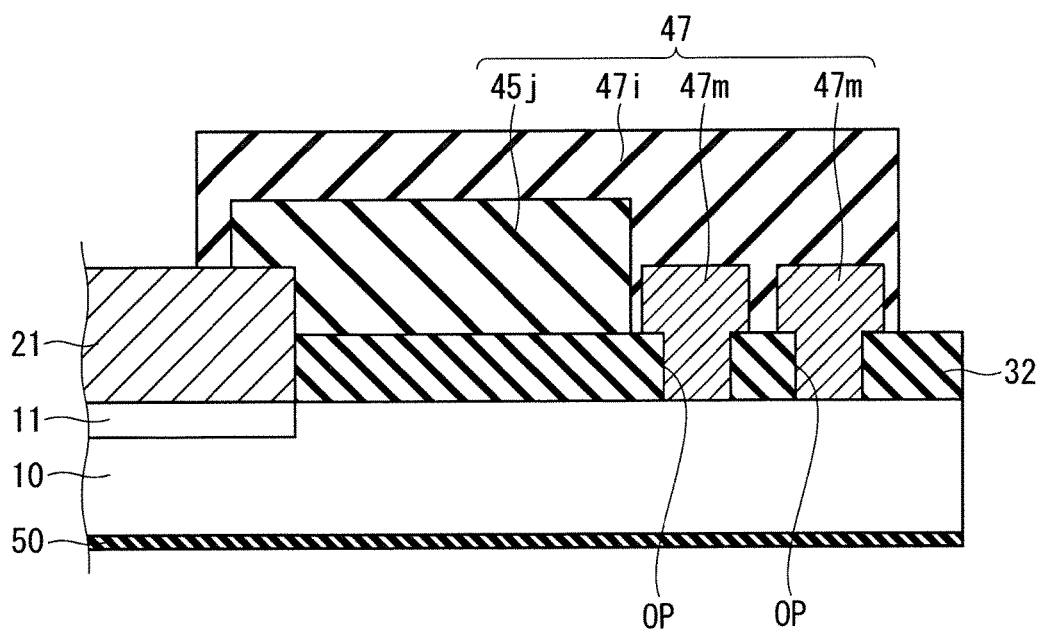
FIG. 24 is a partial cross-sectional view schematically illustrating a process in the method for fabricating the semiconductor device according to the seventh embodiment of the present invention.
Figure 25:
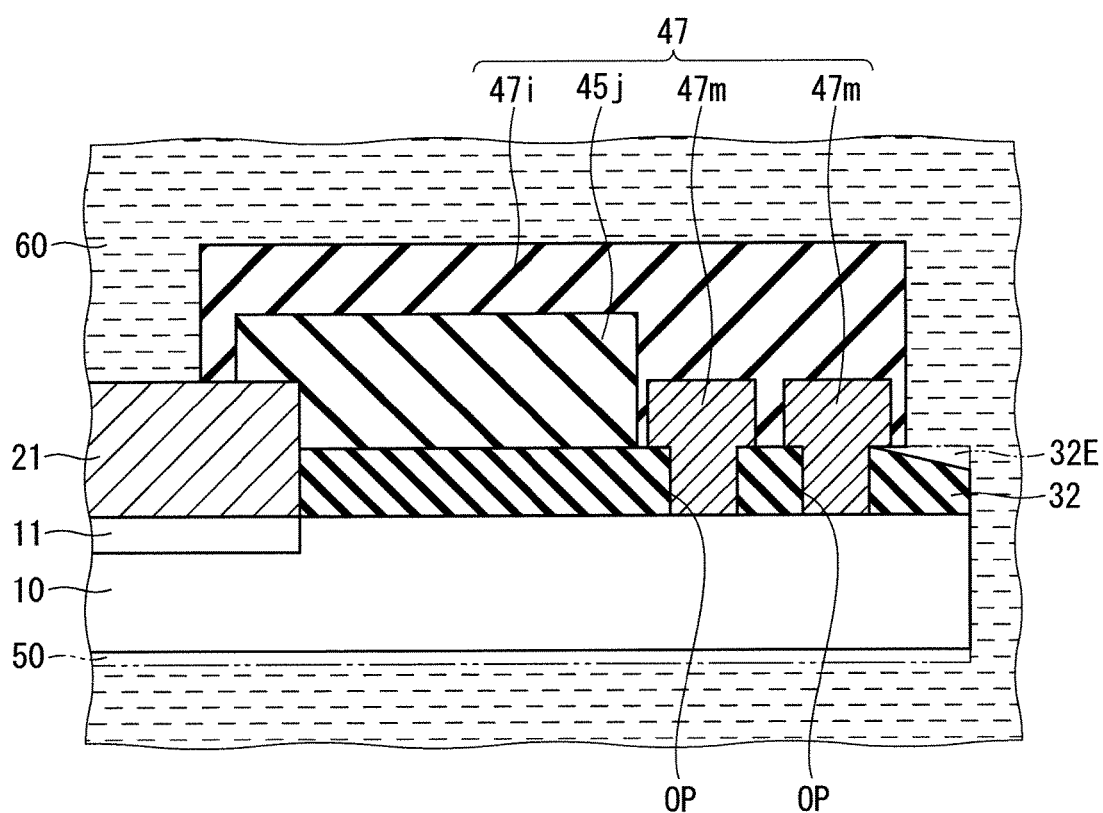
FIG. 25 is a partial cross-sectional view schematically illustrating a process in the method for fabricating the semiconductor device according to the seventh embodiment of the present invention.

Referring to FIG. 24 and FIG. 25, respectively, the diode 97 can be fabricated through processes similar to the processes in FIGS. 21 and 22 according to the sixth embodiment. In the present embodiment, the metal films 47*m* are formed, before the outer insulation film 47*i* is formed. The material of the metal films 47*m* can be the same as the material of an anode electrode film 21. In this case, the metal films 47*m* can be formed at the same time as the process for forming the anode electrode film 21 (FIG. 2: the step S40).

Further, the structures other than the aforementioned structures are substantially the same as the structures according to the aforementioned sixth embodiment and, therefore, the same or corresponding components are designated by the same reference characters and will not be described redundantly.

Eighth Embodiment

Figure 26:
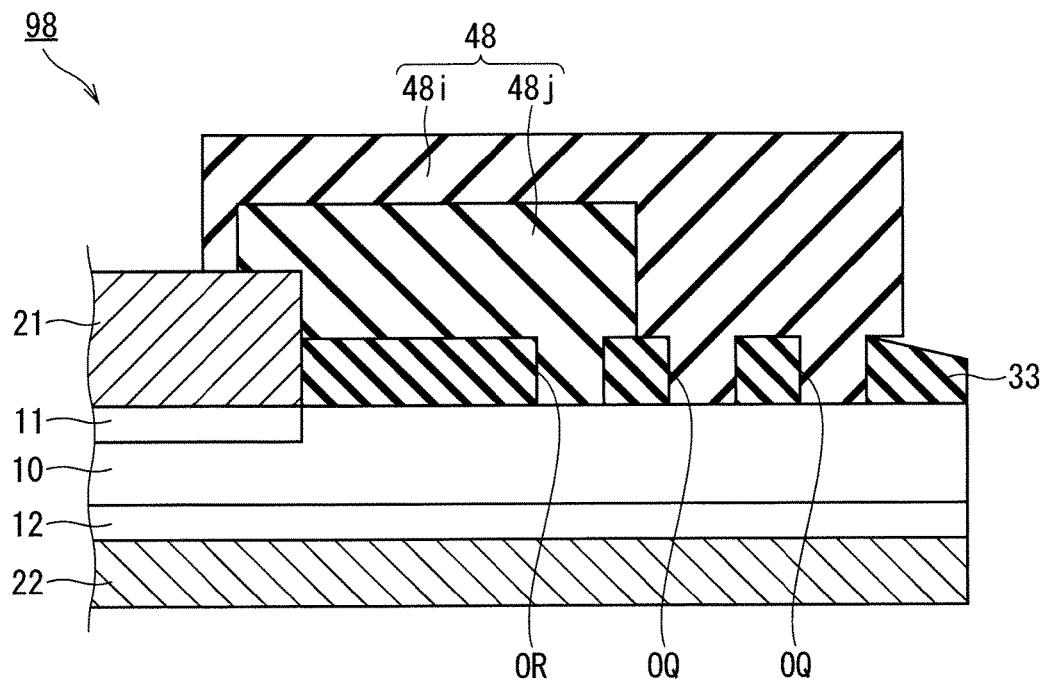
FIG. 26 is a partial cross-sectional view schematically illustrating the structure of a semiconductor device according to an eighth embodiment of the present invention.

FIG. 26 is a partial cross-sectional view schematically illustrating the structure of a diode 98 according to the present embodiment. The diode 98 includes a SiO₂ film 33 (a silicon oxide film) and a protective structural member 48 (a structural member), instead of the SiO₂ film 32 and the protective structural member 46 (FIG. 20: the sixth embodiment).

The SiO₂ film 33 is provided with plural opening portions including outer peripheral opening portions OQ (first opening portions), and an inner peripheral opening portion OR (a second opening portion) disposed in an inner side with respect to the outer peripheral opening portions OQ. The protective structural member 48 includes an insulation film having an outer insulation film 48*i* (a first film) which is the same as the outer insulation film 46*i* (FIG. 20), and having an inner insulation film 48*j* (a second film). The material (a first material) of the outer insulation film 48*i* is a polyimide, in the present embodiment. The material (a second material) of the inner insulation film 48*j* is different from the material of the outer insulation film 48*i* and can be the same as that of the insulation film 41*i* (FIG. 1: the first embodiment). The outer insulation film 48*i* and the inner insulation film 48*j* reach a Si substrate 10 in the outer peripheral opening portions OQ and the inner peripheral opening portion OR, respectively. The inner insulation film 48*j* is disposed on the SiO₂ film 33 and is extended onto an end portion of an anode electrode film 21. The outer insulation film 48*i* is disposed on the SiO₂ film 33 on which the inner insulation film 48*j* is provided. The outer insulation film 48*i* covers the inner insulation film 48*j* and extends onto the end portion of the anode electrode film 21.

Figure 27:
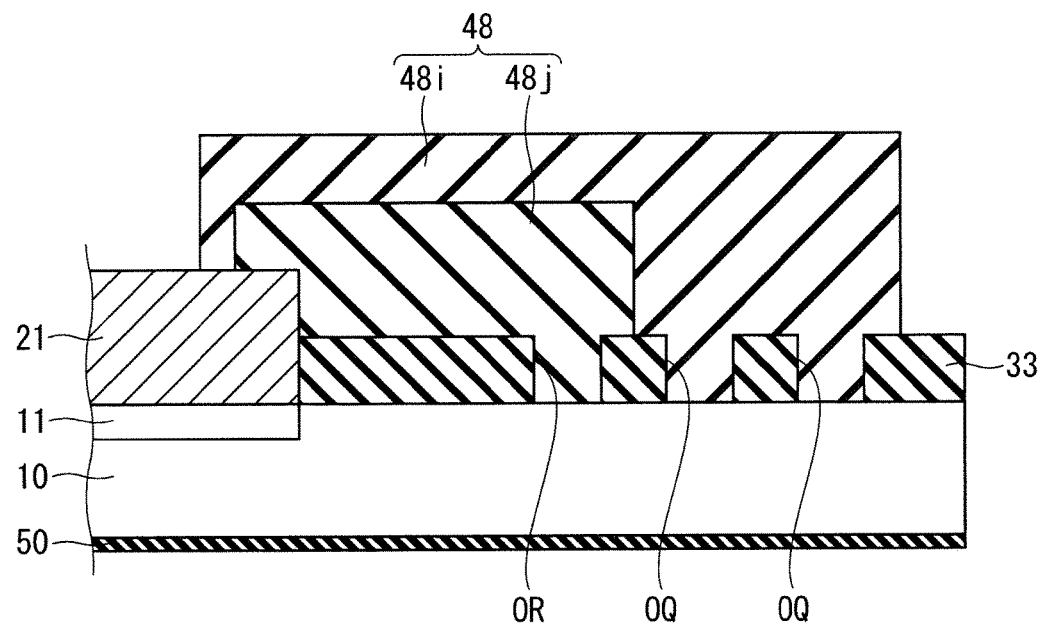
FIG. 27 is a partial cross-sectional view schematically illustrating a process in the method for fabricating the semiconductor device according to the eighth embodiment of the present invention.
Figure 28:
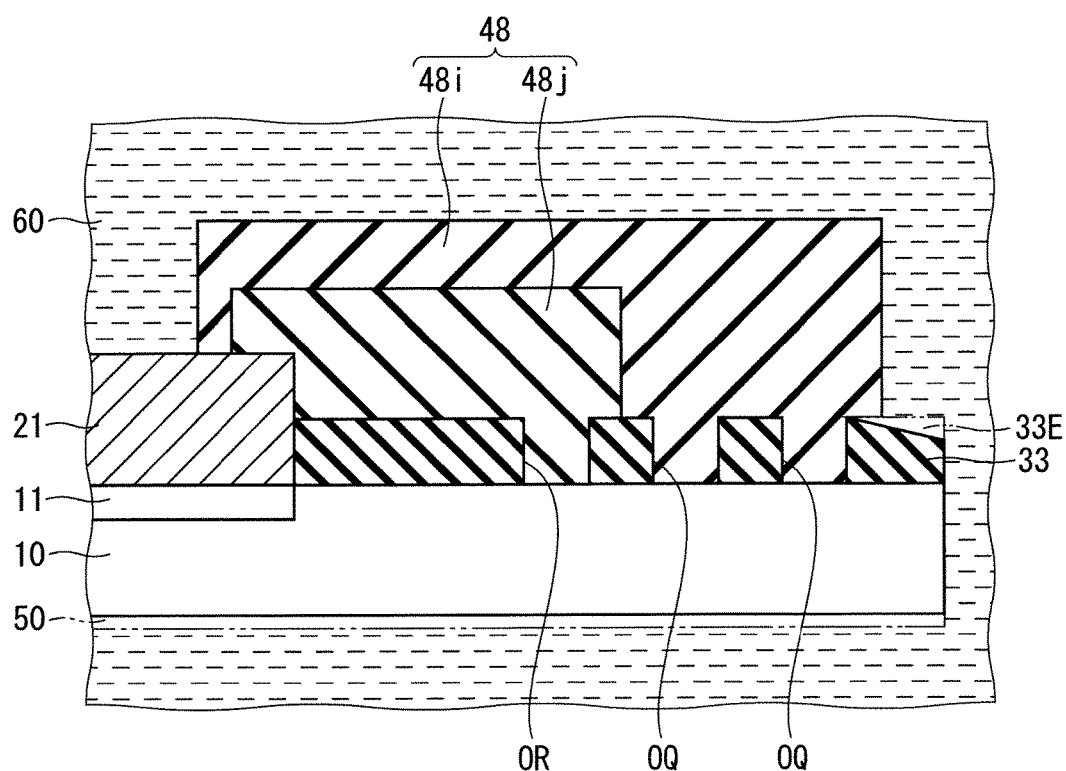
FIG. 28 is a partial cross-sectional view schematically illustrating a process in the method for fabricating the semiconductor device according to the eighth embodiment of the present invention.

Referring to FIG. 27 and FIG. 28, respectively, the diode 98 can be fabricated through substantially the same processes as the processes in FIGS. 21 and 22 according to the sixth embodiment. Further, a two-dot chain-line portion 33E (FIG. 28) in the SiO₂ film 33 schematically represents the etched portion, similarly to the two-dot chain-line portion 31E (FIG. 4) in the SiO₂ film 31.

Further, the structures other than the aforementioned structures are substantially the same as the structures according to the aforementioned sixth embodiment and, therefore, the same or corresponding components are designated by the same reference characters and will not be described redundantly.

Ninth Embodiment

Figure 29:
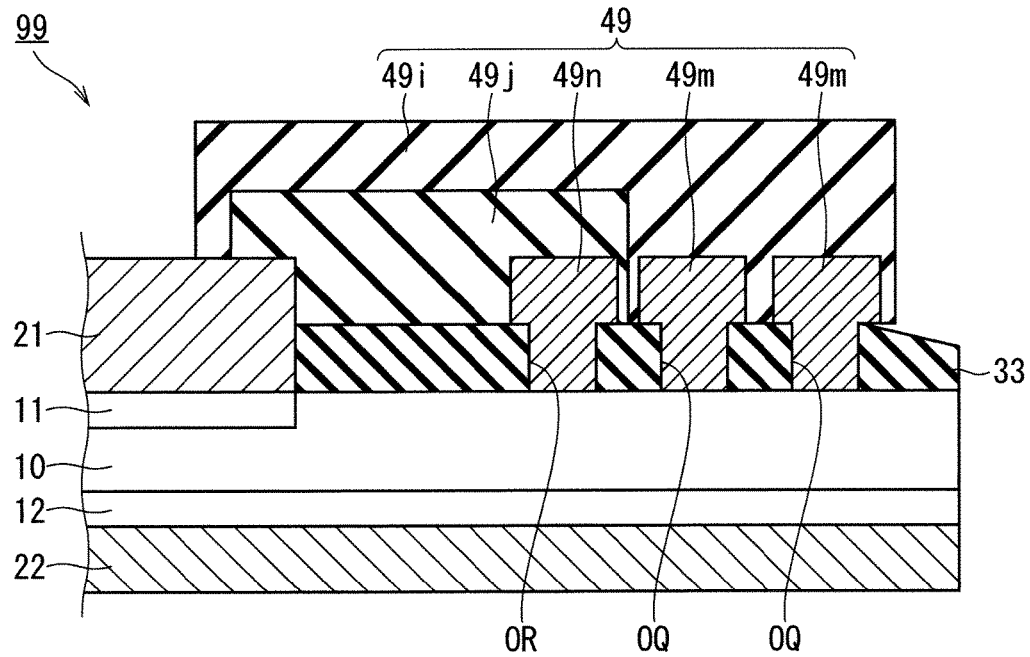
FIG. 29 is a partial cross-sectional view schematically illustrating the structure of a semiconductor device according to a ninth embodiment of the present invention.

FIG. 29 is a partial cross-sectional view schematically illustrating the structure of a diode 99 according to the present embodiment. The diode 99 includes a protective structural member 49 (a structural member), instead of the protective structural member 48 (FIG. 26: the eighth embodiment). The protective structural member 49 includes an insulation film having an outer insulation film 49*i* (a first film) and an inner insulation film 49*j* (a second film), and a metal film having outer peripheral metal films 49*m* (a first metal portion) and an inner peripheral metal film 49*n* (a second metal portion). The outer peripheral metal films 49*m* and the inner peripheral metal film 49*n* reach a Si substrate 10 in outer peripheral opening portions OQ and an inner peripheral opening portion OR, respectively. Each of the outer peripheral metal films 49*m* and the inner peripheral metal film 49*n* is the same as the metal film 43*m* (FIG. 11: the third embodiment).

The respective materials of the outer insulation film 49*i* and the inner insulation film 49*j* are the same as the materials of the outer insulation film 48*i* and the inner insulation film 48*j* (FIG. 26: the eighth embodiment). The outer insulation film 49*i* and the inner insulation film 49*j* cover the outer peripheral metal films 49*m* and the inner peripheral metal film 49*n*, respectively. The inner insulation film 49*j* is disposed on a SiO₂ film 33 and is extended onto an end portion of an anode electrode film 21. The outer insulation film 49*i* is disposed on the SiO₂ film 33 on which the inner insulation film 49*j* is provided. The outer insulation film 49*i* covers the inner insulation film 49*j* and is extended onto the end portion of the anode electrode film 21.

Figure 30:
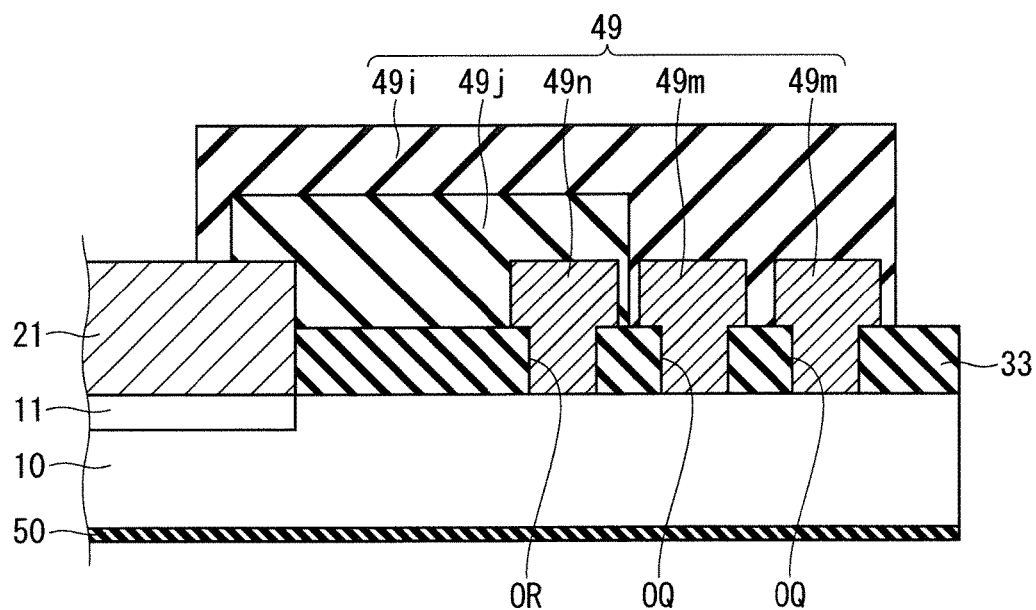
FIG. 30 is a partial cross-sectional view schematically illustrating a process in the method for fabricating the semiconductor device according to the ninth embodiment of the present invention.
Figure 31:
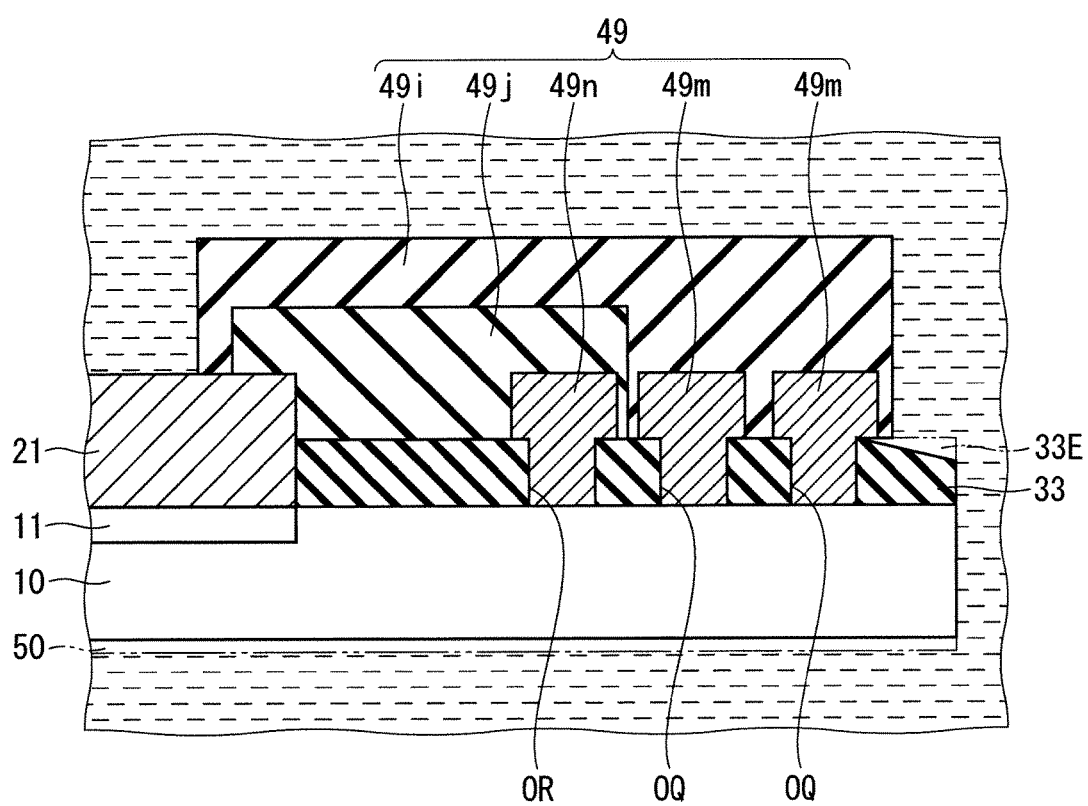
FIG. 31 is a partial cross-sectional view schematically illustrating a process in the method for fabricating the semiconductor device according to the ninth embodiment of the present invention.

Referring to FIG. 30 and FIG. 31, respectively, the diode 99 can be fabricated through processes similar to the processes in FIGS. 27 and 28 according to the eighth embodiment. In the present embodiment, the inner peripheral metal film 49n is formed before the inner insulation film 49j is formed, and the outer peripheral metal films 49m are formed before the outer insulation film 49i is formed. The materials of the outer peripheral metal films 49m and the inner peripheral metal film 49n can be the same as the material of the anode electrode film 21. In this case, the outer peripheral metal films 49m and the inner peripheral metal film 49n can be formed at the same time as the process for forming the anode electrode film 21 (FIG. 2: the step S40).

Further, the structures other than the aforementioned structures are substantially the same as the structures according to the aforementioned eighth embodiment and, therefore, the same or corresponding components are designated by the same reference characters and will not be described redundantly.

Although the diodes 91 to 99 have been described in the aforementioned embodiments, the semiconductor device is not limited to a diode and can be also a transistor, for example. Further, there have been described cases where the surface cleaned through wet etching is the surface (the lower surface in FIG. 6) of the silicon substrate which is opposite from the surface (the upper surface in FIG. 6) thereof on which the silicon oxide film is disposed. However, the relationship between the position on the silicon substrate which is cleaned and the position of the silicon oxide film can be properly selected according to the structure of the semiconductor device to be fabricated. Further, although there has been described removal of a natural oxide film on the silicon substrate through wet etching, the object to be removed through wet etching is not limited to a natural oxide film and can be also other foreign substances on the silicon substrate.

In the present invention, the respective embodiments can be arbitrarily combined and, also, various changes, omissions and the like can be made to the embodiments, within the scope of the invention. Although the present invention has been described in detail, the aforementioned descriptions are merely illustrative in all aspects, and the present invention is not limited thereto. It should be understood that countless examples of modifications which have not been illustrated herein can be conceived without departing from the scope of the present invention.

REFERENCE SIGNS LIST

OP: opening portion
OQ: outer peripheral opening portion (first opening portion)
OR: inner peripheral opening portion (second opening portion)
10: Si substrate (silicon substrate)
11: anode layer
12: cathode layer
21: anode electrode film
22: cathode electrode film
31 to 33: SiO$_2$ film (silicon oxide film)
41 to 49: protective structural member (structural member)
41i, 42i, 43i, 44i: insulation film
43m, 44m, 47m: metal film
45i, 46i, 47i: outer insulation film
45j: inner insulation film
48i, 49i: outer insulation film (first film)
48j, 49j: inner insulation film (second film)
49m: outer peripheral metal film (first metal portion)
49n: inner peripheral metal film (second metal portion)
50: natural oxide film
91 to 99: diode (semiconductor device)

The invention claimed is:

1. A method for fabricating a semiconductor device comprising:
   forming a silicon oxide film having at least one opening, on a silicon substrate;
   forming a structural member formed of a material less prone to be etched by hydrofluoric acid than said silicon oxide film, said structural member being provided on said silicon oxide film and reaching said silicon substrate in said opening; and
   performing wet etching using hydrofluoric acid, on said silicon substrate on which said silicon oxide film and said structural member are provided, an interface between said silicon oxide film and said structural member being exposed to hydrofluoric acid in said performing wet etching,
   wherein
   said structural member includes an insulation film,
   an interface between said silicon oxide film and said insulation film is exposed to hydrofluoric acid in said performing wet etching, and
   performing said wet etching results in a portion of an upper surface of said silicon oxide film to one side of said opening being etched, and another portion of said upper surface of said silicon oxide film to another side of said opening not being etched.

2. The method for fabricating a semiconductor device according to claim 1, wherein
   said insulation film reaches said silicon substrate in said opening.

3. The method for fabricating a semiconductor device according to claim 1, wherein
   said structural member includes a metal film which reaches said silicon substrate in said opening.

4. The method for fabricating a semiconductor device according to claim 1, wherein
   said performing wet etching includes cleaning said silicon substrate.

5. The method for fabricating a semiconductor device according to claim 2, wherein
   said at least one opening is one of a plurality of openings.

6. The method for fabricating a semiconductor device according to claim 5, wherein
   said insulation film includes a first film formed of a first material, and a second film formed of a second material different from said first material, and
   said first film and said second film reach said silicon substrate, respectively, in a first opening and a second opening which are included in said plurality of openings.

7. The method for fabricating a semiconductor device according to claim 3, wherein
   said at least one opening is one of a plurality of openings.

8. The method for fabricating a semiconductor device according to claim 7, wherein
   said metal film includes a first metal portion and a second metal portion which reach said silicon substrate, respectively, in a first opening and a second opening which are included in said plurality of openings, and
   said insulation film includes a first film which is formed of a first material and covers said first metal portion, and a second film which is formed of a second material different from said first material and covers said second metal portion.

\* \* \* \* \*